US005165170A

United States Patent [19]

Sagol et al.

[11] Patent Number: 5,165,170

[45] Date of Patent: Nov. 24, 1992

[54] RAZOR HAVING INTEGRAL HAIR DETECTION MEANS

[75] Inventors: Sami Sagol, Ramat Hasharon; Benjamin Keren; Shai Levi, both of Misgav, all of Israel

[73] Assignee: Keter Plastic Ltd., Jaffa, Israel

[21] Appl. No.: 788,580

[22] Filed: Nov. 6, 1991

[30] Foreign Application Priority Data

Nov. 8, 1990 [IL] Israel ........................................ 96274

[51] Int. Cl.[5] ........................ B26B 19/42; B26B 21/00; H03F 21/00

[52] U.S. Cl. ........................................ 30/34.05; 30/32; 381/120

[58] Field of Search ........................ 30/32, 34.05, 41.8; 381/56, 120, 122

[56] References Cited

U.S. PATENT DOCUMENTS 3,736,243 5/1973 Duggan .................................. 30/32
3,738,000 6/1973 Samko .................................... 30/32
3,944,756 3/1976 Lininger .............................. 381/120
4,473,794 9/1984 Early et al. ......................... 381/120
4,479,239 10/1984 Rhines ............................... 381/120
4,773,158 9/1988 Kertzman ............................. 30/32

*Primary Examiner*—Douglas D. Watts
*Assistant Examiner*—Paul Heyrana
*Attorney, Agent, or Firm*—Helfgott & Karas

[57] ABSTRACT

A razor having an integral hair detection means, the razor comprising a razor assembly mounted on a handle for brushing against a surface of a person's face and vibrating in response to contact with hairs thereon and a pickup coupled to the handle and responsive to vibrations produced therein for generating a corresponding signal. Electronic or acoustic audio frequency amplifying means are provided within the handle for amplifying the signal from the pickup as an audio frequency output. In use, the person shaving hears the amplified vibrations either directly via a loudspeaker or via an earpiece, so as to obtain feedback relating to the surface quality of the shave.

10 Claims, 1 Drawing Sheet

RAZOR HAVING INTEGRAL HAIR DETECTION MEANS

FIELD OF THE INVENTION

This invention relates to a razor and in particular to a safety razor.

BACKGROUND OF THE INVENTION

It has been a constant requirement throughout the development of the safety razor to achieve means for improving the surface quality of the resulting shave. In spite of the many developments which have been made in this respect, the only way in which a person can check the actual smoothness of his shave and verify that he has not overlooked part of his beard, is manually to feel his face or to use a mirror after shaving.

Safety razors are normally used wet with the aid of a suitable shaving cream and this makes it difficult for a person to distinguish between those areas of his beard which have been effectively shaved and those which have not, until the shaving cream has been removed.

SUMMARY OF THE INVENTION

It is an object of the invention to provide a razor having an integral hair detection means and which provides a real-time feedback during shaving of areas of beard remaining to be shaved.

According to the invention there is provided a razor having an integral hair detection means, the razor comprising:

- a razor assembly mounted on a handle for brushing against a surface of a person's face and vibrating in response to contact with hairs thereon,
- a pickup coupled to the handle and responsive to vibrations produced therein for generating a corresponding signal, and
- audio frequency amplifying means within the handle for amplifying the signal from the pickup as an audio frequency output.

The amplifying means may be either acoustic or electronic. In the event that an acoustic amplifier is used, a flexible membrane may be mounted within a hollow portion of the razor handle and the resulting amplified sound waves may be conducted to a suitable acoustic earpiece by means of a flexible tube.

If the amplifying means is electronic, then either a loudspeaker may be mounted within the handle or, alternatively, an output socket may be provided for electrical connection to a suitable earpiece or an auxiliary loudspeaker.

BRIEF DESCRIPTION OF THE DRAWINGS

In order to have a better understanding of the invention and to show how the same may be used in practice, the invention will be described, by way of non-limiting example only, with reference to the accompanying drawings, in which.

DETAILED DESCRIPTION OF PREFERRED EMBODIMENTS

Figure 1:
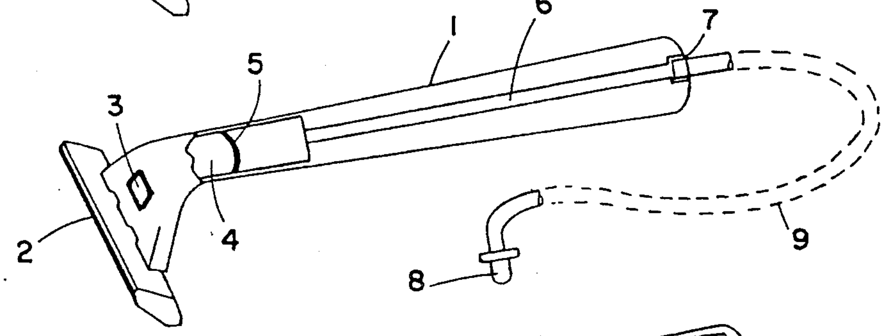
FIG. 1 is a partially cut-away pictorial representation showing schematically a first embodiment according to the invention.

FIG. 1 shows a first embodiment of the invention comprising a razor having a handle 1 and a razor assembly 2 mounted at an end thereof. Also mounted on the handle 1 close to the razor assembly 2 is an acoustic pickup 3 coupled to a hollow chamber 4 within the handle 1.

Mounted within the hollow chamber 4 is a thin-walled flexible membrane 5 (constituting an amplifying means) for amplifying sound waves transmitted thereto by the acoustic pickup 3.

The hollow chamber 4 is coupled by a hollow tube 6 within the handle 1 to an output socket 7 permitting an acoustic earpiece 8 to be coupled thereto via a flexible hollow tube 9.

The operation of the razor is as follows. As the razor assembly 2 brushes against the surface of a person's face during shaving, it produces audio-frequency vibrations when it comes into contact with short hairs, or stubble, projecting from the surface of the skin. The resulting audio-frequency vibrations are picked up by the acoustic pickup 3, amplified by the flexible membrane 5 and transmitted through the hollow tube 6 within the handle 1 and the flexible hollow tube 9 to the earpiece 8.

Figure 2:
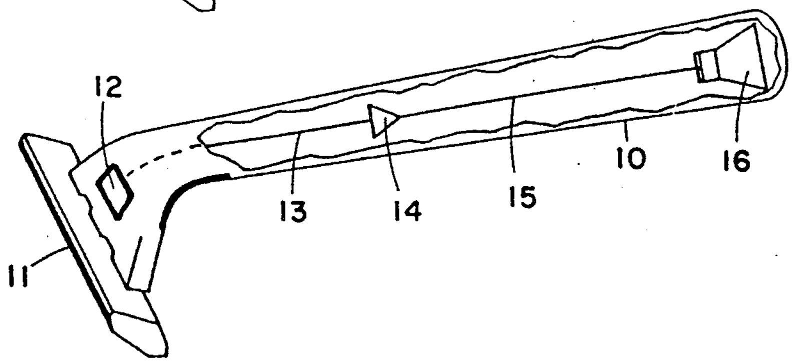
FIG. 2 is a partially cut-away pictorial representation showing schematically a second embodiment according to the invention.

Referring to FIG. 2 of the drawings there is shown a second embodiment of the invention comprising a handle 10 mounted at an end of which is a razor assembly 11. Mounted on the handle 10 adjacent to the razor assembly 11 is a piezo-electric pickup 12 coupled to an input 13 of an electronic amplifier 14, an output 15 thereof being connected to a loudspeaker 16.

The razor assembly 11 vibrates as it brushes against hair or stubble projecting from the surface of a person's face and the resulting vibrations are transduced to an electrical signal by the piezo-electric pickup 12. The electrical signal is amplified by the amplifier 14 and rendered audible by the loudspeaker 16.

Figure 3:
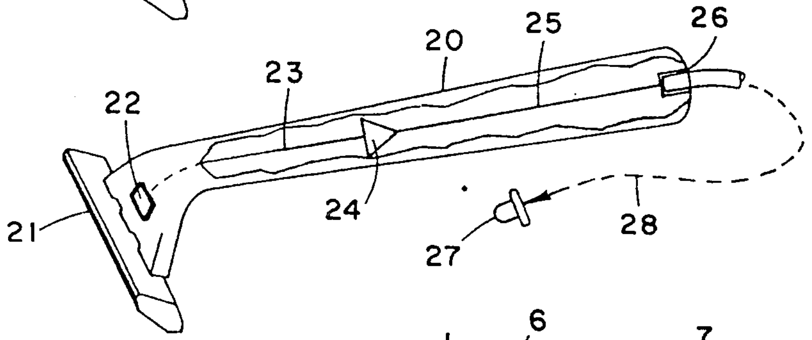
FIG. 3 is a partially cut-away pictorial representation showing schematically a third embodiment according to the invention.

FIG. 3 shows a modification of the embodiment described above having a handle 20 mounted at an end of which is a razor assembly 21. Also mounted on the handle 20 close to the razor assembly 21 is a piezo-electric pickup 22 coupled to an input 23 of an amplifier 24 an output 25 of which is connected to an output socket 26. An electric earpiece 27 may be connected to the output socket 26 by means of a flexible electrical cable 28.

The operation of the assembly is essentially the same as that of the second embodiment described above with reference to FIG. 2 of the drawings.

Figure 4:
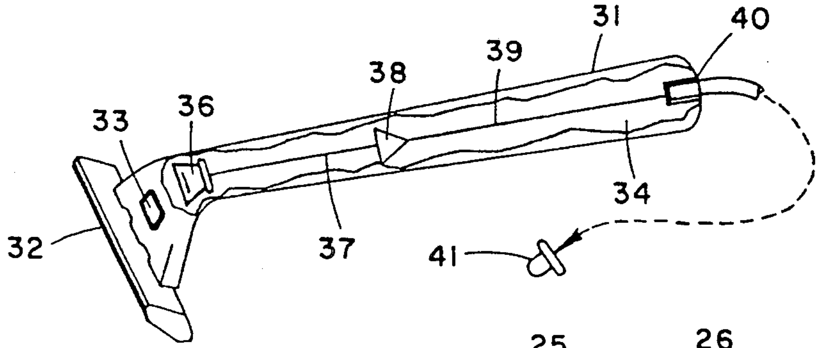
FIG. 4 is a partially cut-away pictorial representation showing a fourth embodiment according to the invention.

FIG. 4 shows a fourth embodiment according to the invention having a handle 31 mounted at an end of which is a razor assembly 32. Also mounted on the handle 31 close to the razor assembly 32 is an acoustic pickup 33 coupled to a hollow chamber 34 within the handle 31.

Mounted within the hollow chamber 34 close to the acoustic pickup 33 is a microphone 36 (constituting a transducer) which is responsive to audio-frequency vibrations produced by the acoustic pickup 33 for generating an electrical signal. The microphone 36 is coupled to an input 37 of an amplifier 38 having an output 39 connected to an output socket 40. An electric earpiece 41 may be connected to the output socket 40 by means of a flexible electrical cable 42.

In such an arrangement, the razor assembly 32 vibrates when it brushes against short hairs, or stubble, projecting from a person's face. The resulting audio-frequency vibrations are converted by the microphone 36 to corresponding electrical signals which are amplified by the amplifier 38 and rendered audible by the earpiece 41.

It will be understood that variations may easily be effected to the embodiments described above without departing from the spirit of the invention. Thus, for example, whilst in the first and third embodiments a single earpiece is shown coupled to the output socket within the razor handle, a pair of interconnected earpieces may equally well be employed. In the fourth embodiment, an integral loudspeaker may be used instead of an earpiece.

Thus, in accordance with the invention there is provided a razor having an integral hair detection means which permits the user to detect areas of stubble remaining to be shaved during the course of shaving.

We claim:

1. A razor device comprising:

a handle;

a razor assembly mounted on said handle for brushing against a surface of a person's face and vibrating in response to contact with hairs thereon; and hair detection means provided integrally with the razor device to detect vibrations of said razor assembly, said hair detecting means including a pickup arranged on and coupled to the handle and being responsive to vibrations produced by said razor assembly for generating a corresponding signal, and audio frequency amplifying means mounted within the handle for amplifying the signal from the pickup as an audio frequency output.

2. The razor device according to claim 1, wherein:

the pickup is constructed to produce audio-frequency vibrations, the amplifying means is acoustic, and the handle is provided with a hollow portion adapted to transmit the amplified audio-frequency vibrations; and further comprising an output socket coupled to the hollow portion for connecting an earpiece thereto.

3. The razor device according to claim 2, wherein the amplifying means includes a flexible membrane.

4. The razor device according to claim 3, wherein the earpiece comprises a flexible hollow tube having at a first end thereof means for connecting to said output socket and having at a second end thereof at least one acoustic earpiece.

5. The razor device according to claim 2, wherein the earpiece comprises a flexible hollow tube having at a first end thereof means for connecting to said output socket and having at a second end thereof at least one acoustic earpiece.

6. The razor device according to claim 1, wherein the amplifying means is electronic, and wherein said hair detection means further includes a transducer mounted inside the handle and being responsive to a pickup signal of said pickup for generating an electrical signal, and an output socket coupled to the amplifying means for connecting an earpiece thereto.

7. The razor device according to claim 6, wherein the earpiece comprises an electrical cable having at a first end thereof a plug for inserting into said output socket and having at a second end thereof at least one electrical earphone.

8. The razor device according to claim 1, wherein the amplifying means is electronic, and wherein said hair detection means further includes a transducer mounted inside the handle and being responsive to a pickup signal of said pickup for generating an electrical signal, and a loudspeaker mounted within the handle and electrically coupled to an output of the amplifying means.

9. The razor device according to claim 1, wherein the pickup is constructed to generate an electrical signal and the amplifying means is electronic; and further comprising a loudspeaker mounted within the handle and electrically coupled to an output of the amplifying means.

10. The razor device according to claim 1, wherein the pickup is constructed to generate an electrical signal and the amplifying means is electronic; further comprising an output socket coupled to the amplifying means for connecting an earpiece thereto.

* * * * *